United States Patent
Easton et al.

(10) Patent No.: US 8,404,028 B2
(45) Date of Patent: Mar. 26, 2013

(54) VACUUM TRAP LABYRINTH

(75) Inventors: Mark Charles Easton, Hopewell Junction, NY (US); Joseph P. DeGeorge, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 13/008,088

(22) Filed: Jan. 18, 2011

(65) Prior Publication Data
US 2012/0180663 A1 Jul. 19, 2012

(51) Int. Cl.
*B01D 45/00* (2006.01)
(52) U.S. Cl. ............ 95/272; 55/437; 55/444; 55/445; 55/446; 55/DIG. 15
(58) Field of Classification Search .......... 95/272; 55/437, 444–446, DIG. 15
See application file for complete search history.

(56) References Cited

U.S. PATENT DOCUMENTS

| 4,435,199 | A | * | 3/1984 | Potkay | 65/414 |
|---|---|---|---|---|---|
| 4,472,174 | A | * | 9/1984 | Chuan | 95/58 |
| 4,735,633 | A | * | 4/1988 | Chiu | 55/315 |
| 5,053,122 | A | | 10/1991 | Carr | |
| 5,122,168 | A | | 6/1992 | Torres | |
| 5,912,368 | A | * | 6/1999 | Satarino et al. | 55/320 |
| 6,066,209 | A | | 5/2000 | Sajoto et al. | |
| 6,193,802 | B1 | | 2/2001 | Pang et al. | |
| 6,402,806 | B1 | | 6/2002 | Schmitt et al. | |
| 6,936,086 | B2 | * | 8/2005 | Harkonen et al. | 55/434 |
| 6,966,936 | B2 | * | 11/2005 | Yamasaki et al. | 55/385.2 |
| 7,141,095 | B2 | | 11/2006 | Aitchison et al. | |
| 7,803,208 | B2 | * | 9/2010 | Kawasaki | 55/446 |

OTHER PUBLICATIONS

Carbone, Q.J. et al.; Cryobaffle Cone Trap; IPCOM000042054D; Mar. 1, 1984.
Carbone, Q.J. et al.; Cryo Tier Baffle; IPCOM000042916D; Jun. 1, 1984.
Carbone, Q.J. et al.; Triple Trap; IPCOM000047346D; Nov. 1, 1983.
Carbone, Q.J. et al.; Combo Oil and Water Trap; IPCOM000055607D; Aug. 1, 1980.
Giammarco, N. T. et al.; Automatic System for Single Wafer Reactive Ion Etching; IPCOM000101236D; Jul. 1, 1990.

* cited by examiner

*Primary Examiner* — Jason M Greene
*Assistant Examiner* — Dung H Bui
(74) *Attorney, Agent, or Firm* — Ian D. Mackinnon; Howard M Cohn

(57) ABSTRACT

Embodiments of the present invention provide a vacuum trap labyrinth with improved trapping characteristics. The vacuum trap labyrinth comprised of an inner part and an outer part that fit together while in use, and come apart for easy cleaning during maintenance. The vacuum trap labyrinth is installed in a catchpot. In one embodiment, an O-ring is used to seal off an area of the catchpot to facilitate a visual inspection.

20 Claims, 8 Drawing Sheets

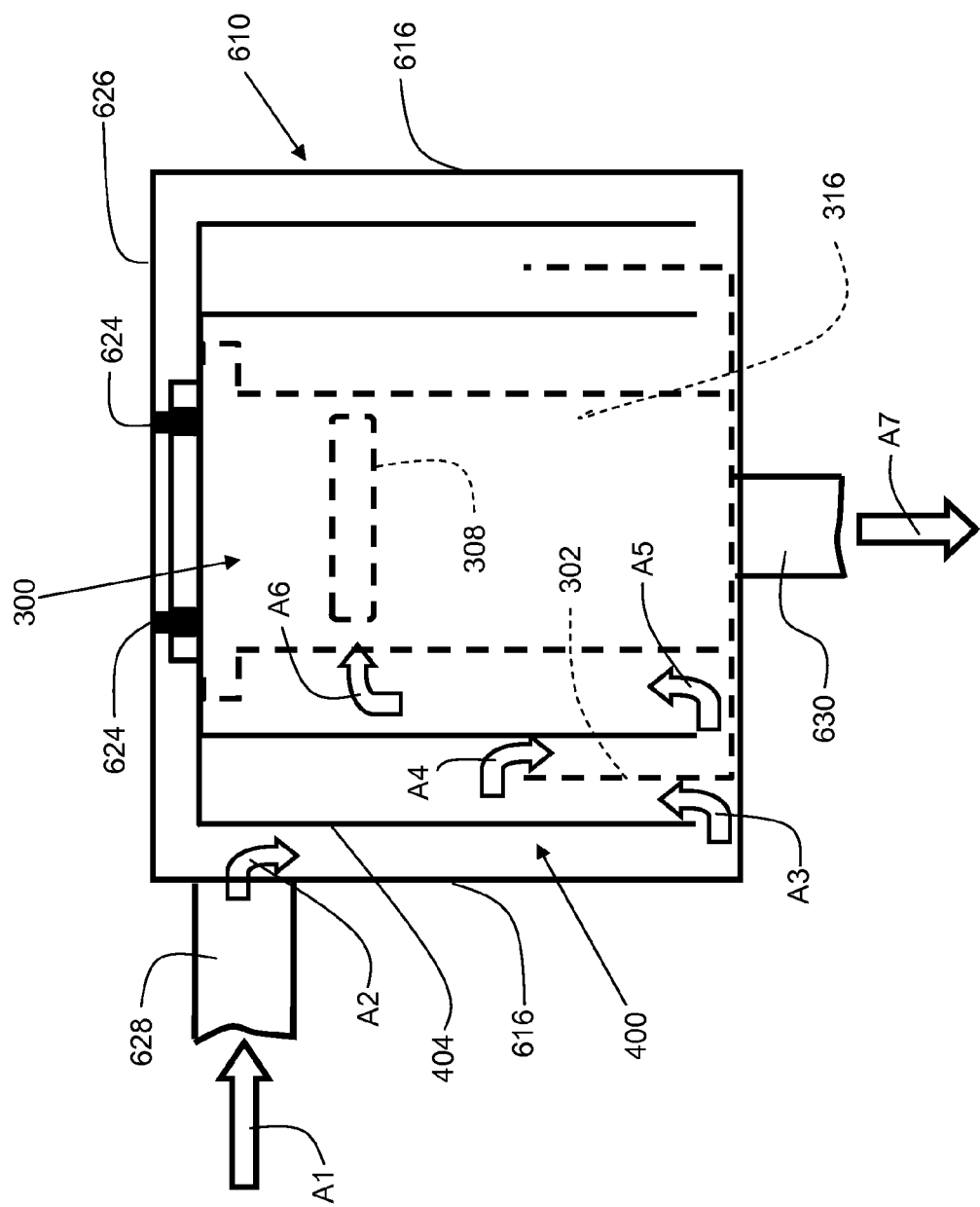

VACUUM TRAP LABYRINTH

FIELD OF THE INVENTION

The present invention relates generally to a semiconductor manufacturing, and more particularly, to an apparatus for trapping residue during a deposition process.

BACKGROUND OF THE INVENTION

During chemical vapor deposition (CVD) processing, deposition gases are released inside a processing chamber to form a thin film layer on the surface of a substrate being processed. Unwanted deposition on areas such as the walls of the processing chamber also occurs during such CVD processes. Because the residence time in the chamber of individual molecules in these deposition gases is relatively short, however, only a small portion of the molecules released into the chamber are consumed in the deposition process and deposited on either the wafer or chamber walls.

The unconsumed gas molecules are pumped out of the chamber along with partially reacted compounds and reaction byproducts through a vacuum line that is commonly referred to as the "foreline." Many of the compounds in this exhausted gas are still in highly reactive states and/or contain residues or particulate matter that can form unwanted deposits in the foreline. Given time, this deposition build-up of powdery residue and/or particulate matter presents a problem. First, the matter is often a substance that may present problems when the vacuum seal is broken and the foreline is exposed to ambient conditions during standard, periodic cleaning operations. Second, if enough of the deposition material builds-up in the foreline, the foreline and/or its associated vacuum pump may clog if it is not appropriately cleaned. Even when periodically cleaned, matter build-up interferes with normal operation of the vacuum pump and can drastically shorten the useful life of the pump. Also, the solid matter may backwash from the foreline into the processing chamber. This can adversely affect wafer yield.

This problem is particularly pronounced in the case of sub-atmospheric CVD (SACVD). In this case, a high TEOS flow creates residue that requires costly and time-consuming filtration. The filters clog frequently, requiring down-time to clean or replace the filters. Therefore, it is desirable to have an improved apparatus for trapping the residues that are byproducts of a CVD process, which can improve product yield, reduce the risk of pump damage, and reduce down-time in a semiconductor fabrication process.

SUMMARY OF THE INVENTION

In one embodiment of the present invention, a vacuum trap labyrinth (VTL) is provided. The VTL comprises an inner part and an outer part. The inner part comprises a base, and a cylindrical sidewall attached to the base. The inner part also has a hollow central shaft having a first end and a second end. The first end is attached to the base at a location within the perimeter of the sidewall. The outer part comprises a top portion which has multiple concentric walls affixed to the top portion. The central shaft of the inner part is disposed within the plurality of concentric walls of the outer part.

In another embodiment of the present invention, a deposition system is provided. The deposition system comprises a pump, a process chamber, a catchpot, and a conduit allowing gas to flow from the process chamber to the catchpot and pump. The catchpot contains inside it a vacuum trap labyrinth (VTL). The VTL comprises an inner part and an outer part. The inner part comprises a base, and a closed-shape sidewall attached to the base. The inner part also has a hollow central shaft having a first end and a second end. The first end is attached to the base at a location within the perimeter of the sidewall. The outer part comprises a top portion which has multiple concentric walls affixed to the top portion. The central shaft of the inner part is disposed within the plurality of concentric walls of the outer part.

In another embodiment of the present invention, a deposition system is provided. The deposition system comprises a pump, a process chamber, a catchpot, and a conduit allowing gas to flow from the process chamber to the catchpot and pump. The catchpot contains inside it a vacuum trap labyrinth (VTL). The VTL comprises an inner part and an outer part. The inner part comprises a base, and a cylindrical sidewall attached to the base. The inner part also has a hollow central shaft having a first end and a second end. The first end is attached to the base at a location within the perimeter of the sidewall. The outer part comprises a top portion which has multiple concentric walls affixed to the top portion. The central shaft of the inner part is disposed within the plurality of concentric walls of the outer part. The second end of the central shaft of the inner part of the vacuum trap labyrinth comprises an annular groove. An O-ring is disposed in the annular groove, and the O-ring contacts the underside of the top of the catchpot.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 is a block diagram of a prior art semiconductor deposition system.

FIG. 2 is a detailed view of a prior art catchpot filter.

FIG. 3A is a side view of the inner part of a vacuum trap labyrinth in accordance with an embodiment of the present invention.

FIG. 3B is a top-down view of the inner part of the vacuum trap labyrinth shown in

FIG. 3A.

Figure 3A:
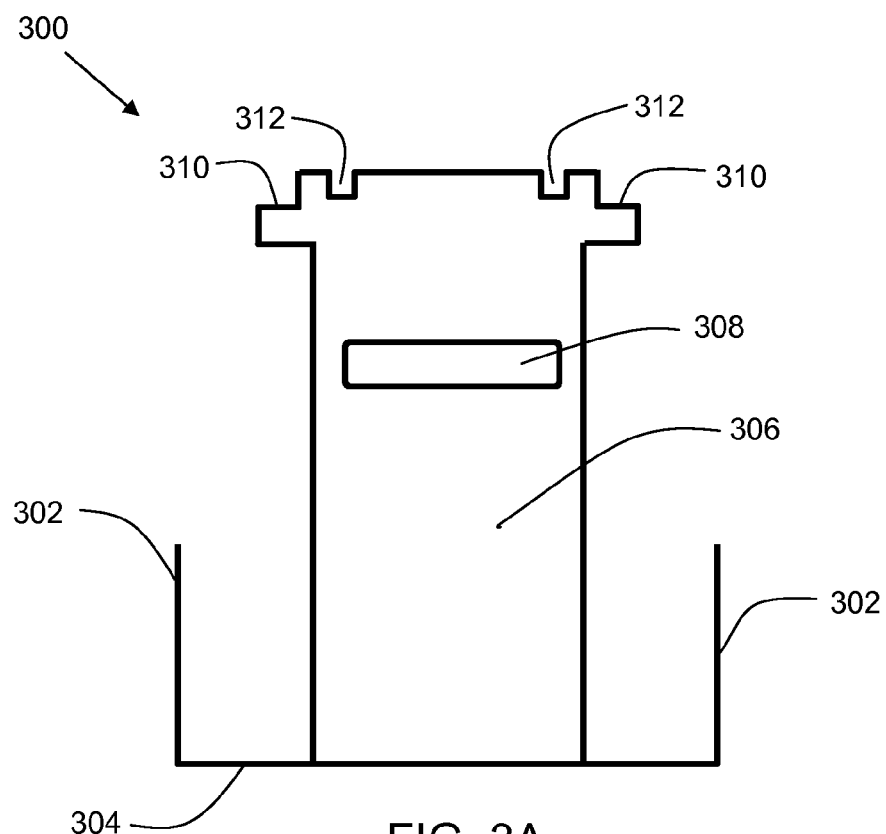
Figure 3B:
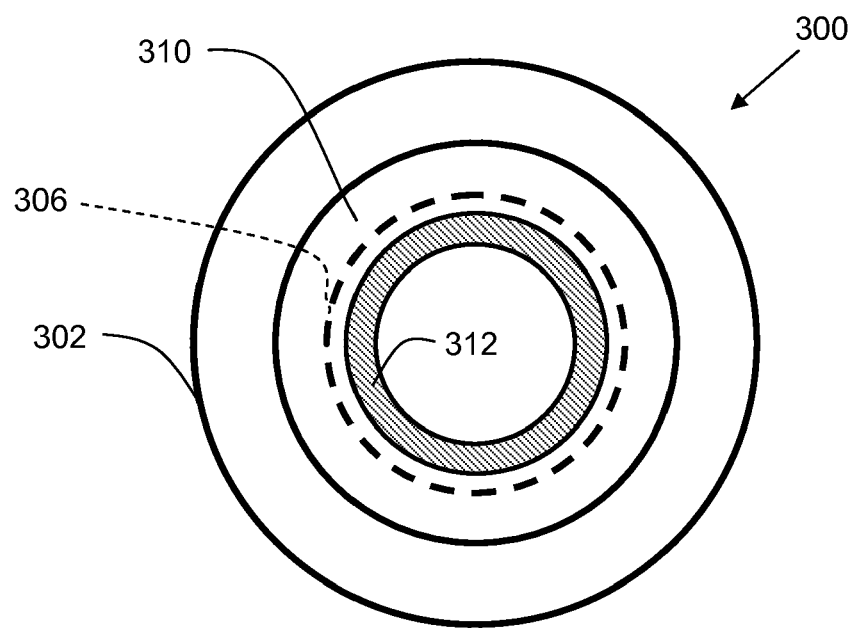
Figure 3C:
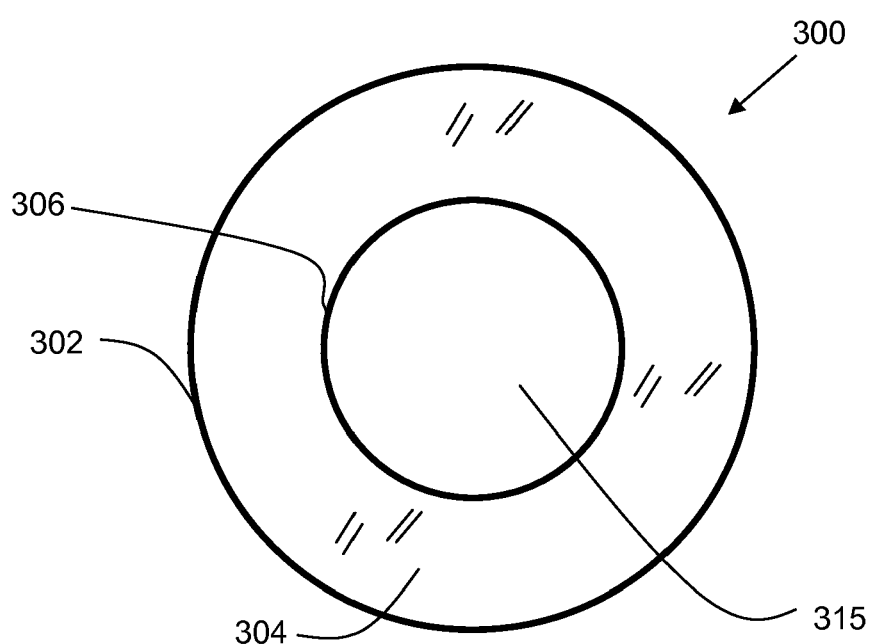

FIG. 3C is a bottom-up view of the inner part of the vacuum trap labyrinth shown in FIG. 3A.

Figure 3D:
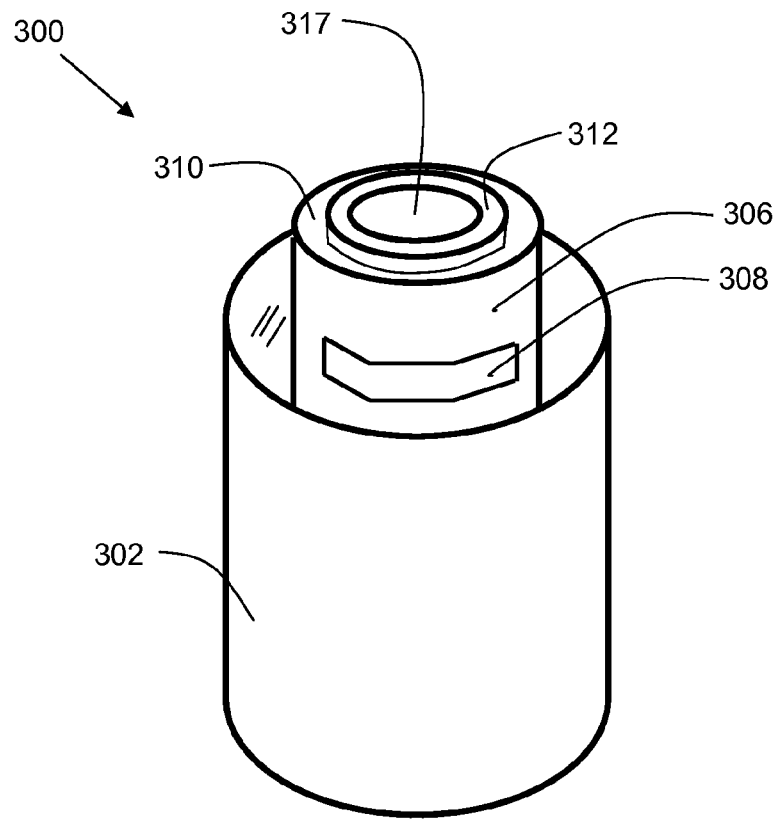

FIG. 3D is a perspective view of the inner part of the vacuum trap labyrinth shown in FIG. 3A.

Figure 4A:
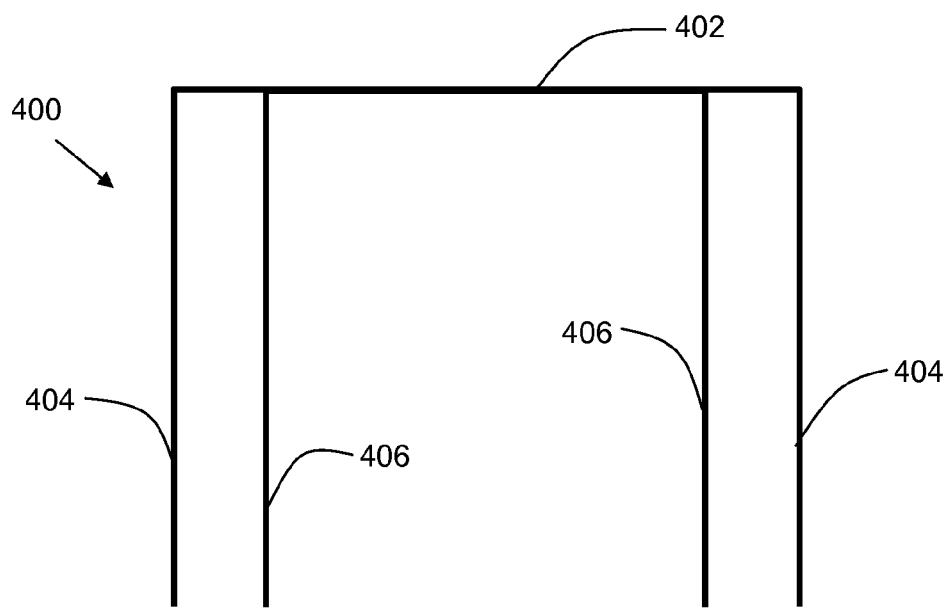

FIG. 4A is a side view of the outer part of a vacuum trap labyrinth in accordance with an embodiment of the present invention.

Figure 4B:
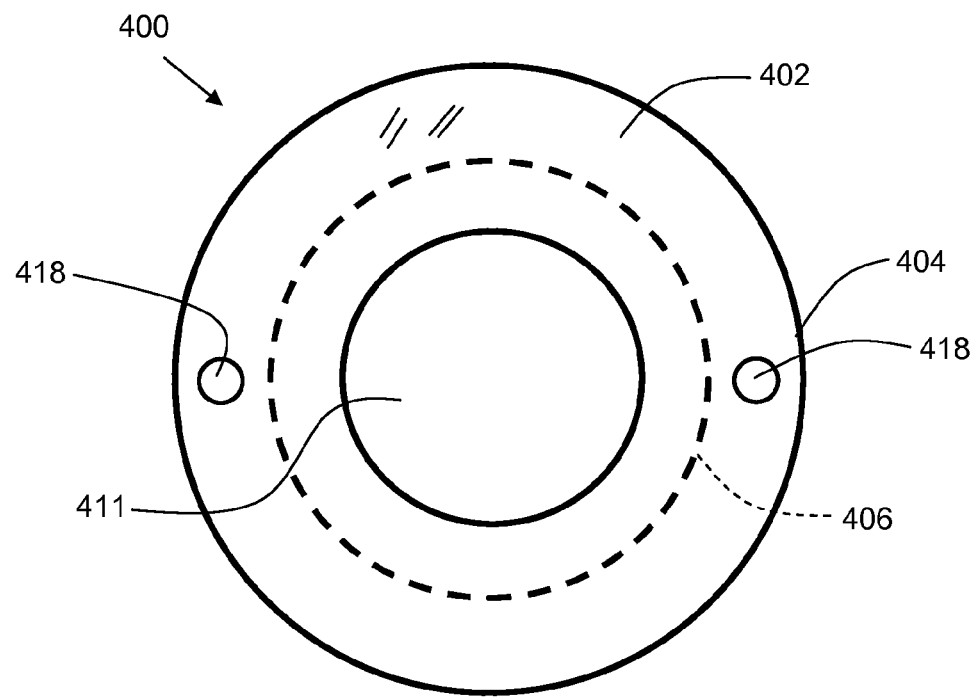

FIG. 4B is a top-down view of the outer part of the vacuum trap labyrinth shown in FIG. 4A.

Figure 4C:
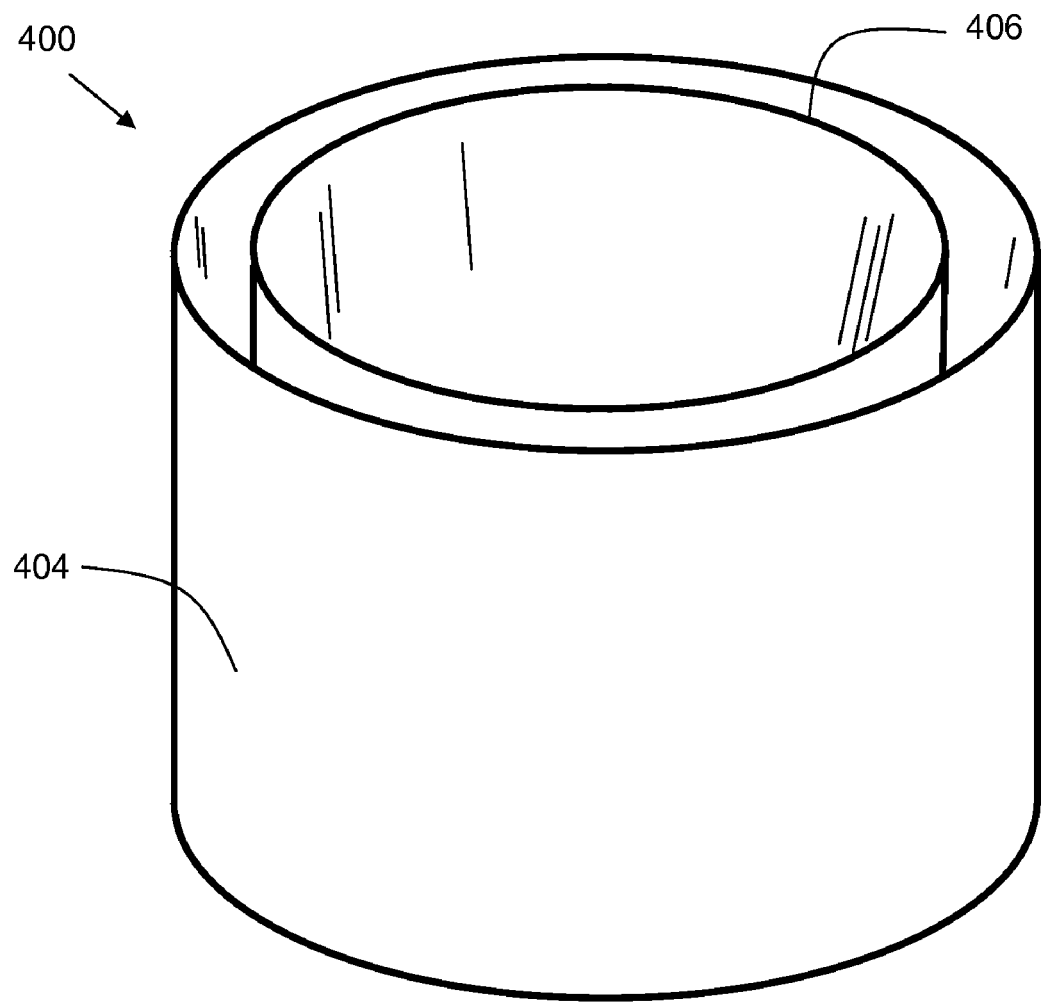

FIG. 4C is an inverted perspective view of the outer part of the vacuum trap labyrinth shown in FIG. 4A.

Figure 5:
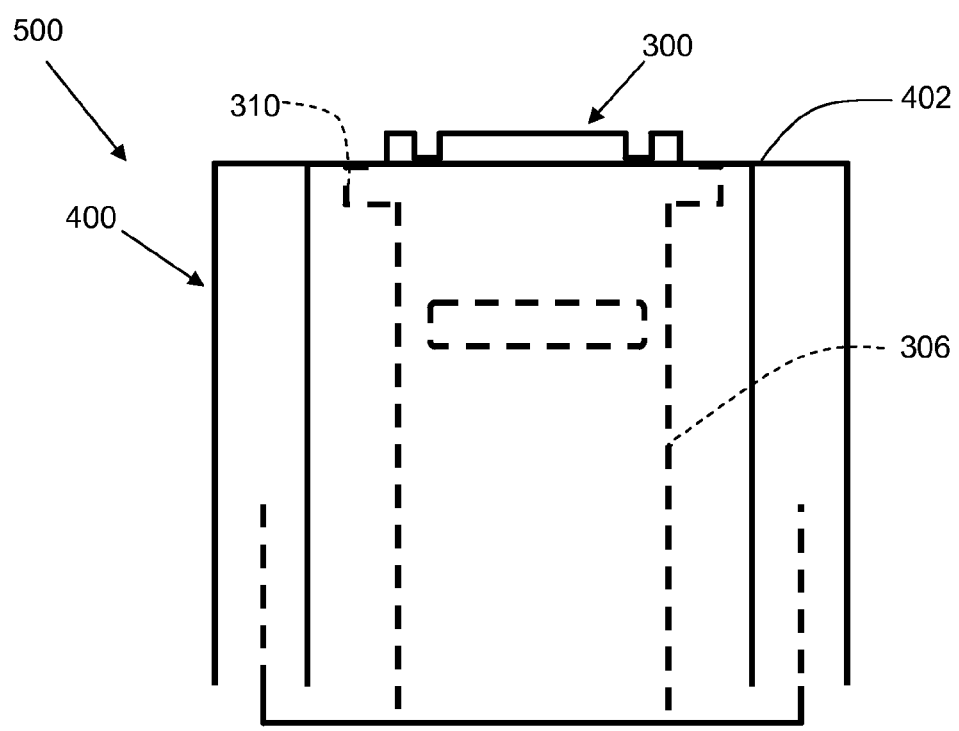

FIG. 5 is a side view showing the outer part and inner part of the vacuum trap labyrinth as assembled.

FIG. 6 is a side view showing the outer part and inner part of the vacuum trap labyrinth as assembled within a catchpot.

Figure 7:
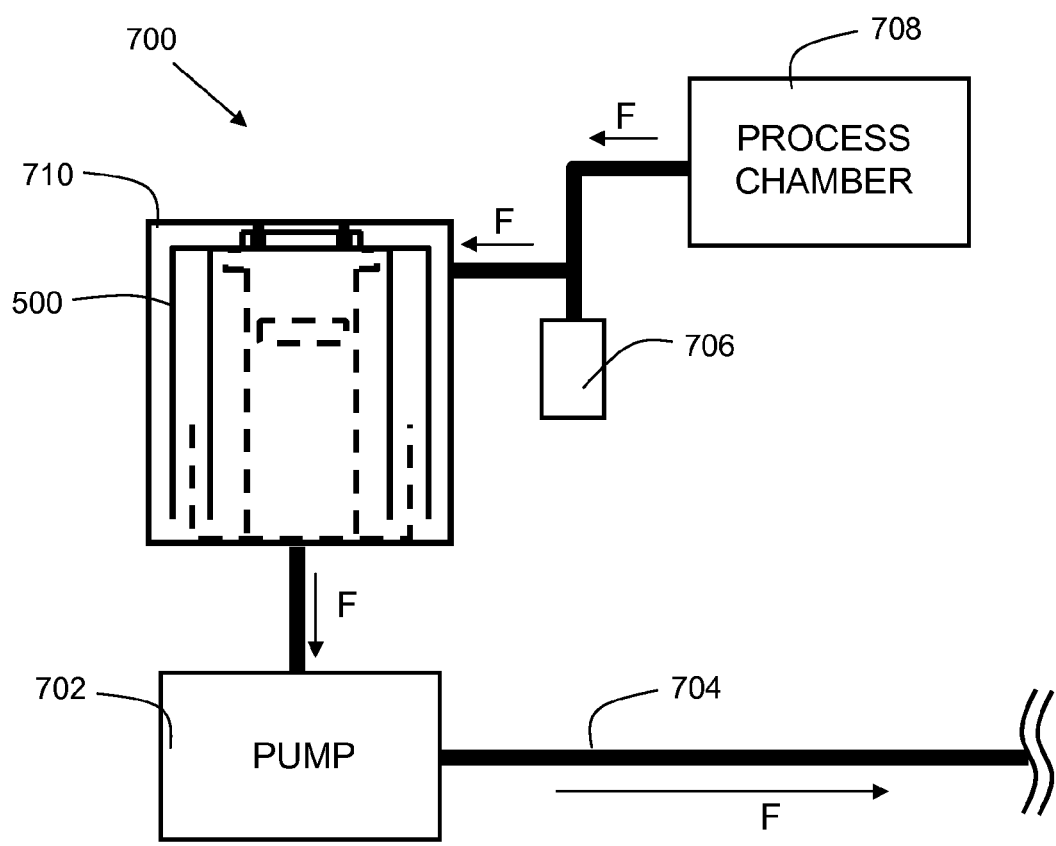

FIG. 7 is a block diagram of a semiconductor deposition system incorporating a catchpot with a vacuum trap labyrinth in accordance with an embodiment of the present invention.

DETAILED DESCRIPTION

Figure 1:
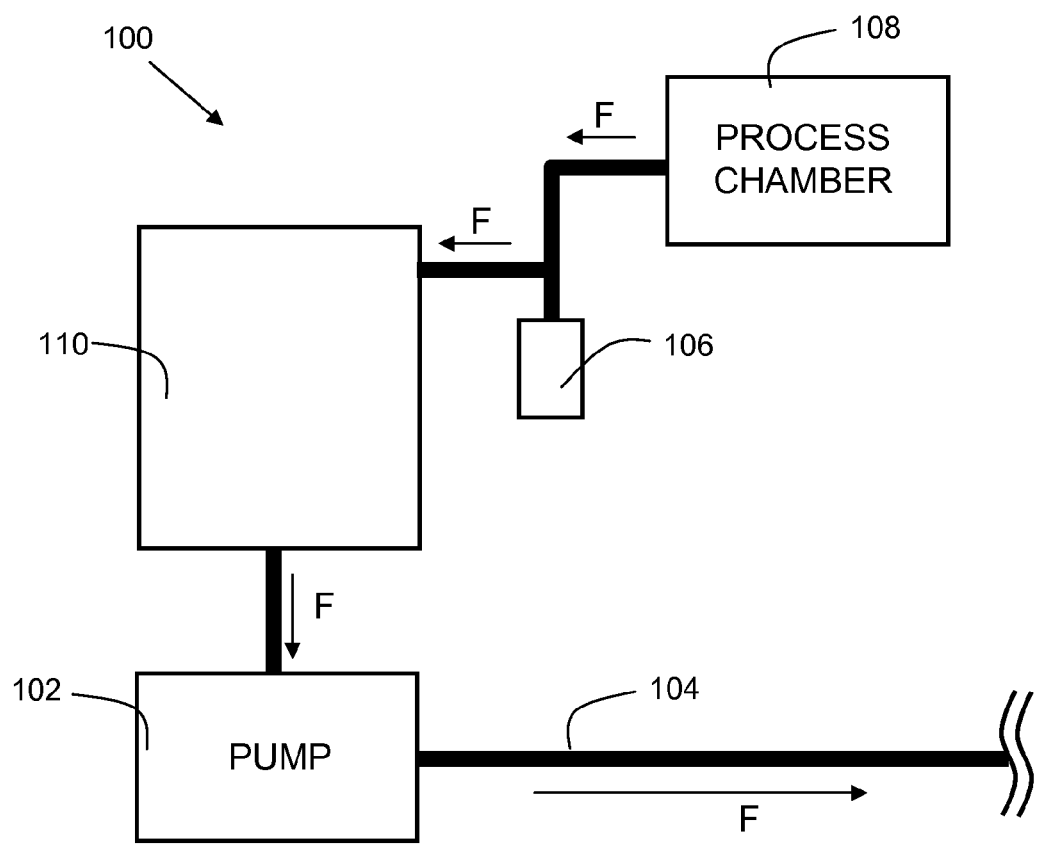

For the purpose of providing context for embodiments of the present invention, a prior art system will be briefly described. In FIG. 1, a block diagram of a prior art semiconductor deposition system 100 is shown. System 100 comprises a pump 102, and a plurality of conduit lines, shown generally as 104 for pumping a gas mixture throughout system 100. The pumped material flows in the direction indicated by arrows F. The gas mixture is pumped from process chamber 108, which may comprise a chemical vapor deposition (CVD) process chamber. When the gas exits process chamber 108, it then proceeds to catchpot 110. Optionally, a trap 106 may be used to trap some heavier residue. Residue that is not caught in trap 106 proceeds to catchpot 110. Within the catchpot 110 is a filter element that traps some residue before the gas goes through pump 102 to then exit the system, typically being pumped to an abatement unit (not shown).

Figure 2:
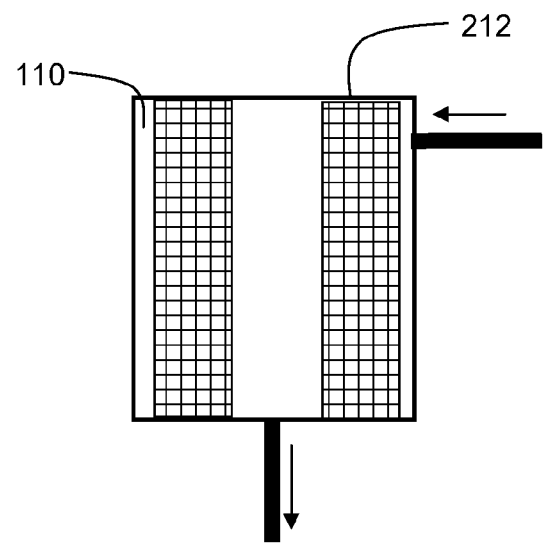

FIG. 2 is a detailed cutaway view of catchpot 110, and shows a filter element 212 contained within the catchpot. The filter element 212 is intended to stop residue from entering pump 102 (FIG. 1), as residue in the pump may reduce pump efficiency or even damage the pump. One disadvantage of such a system is that filter element 212 frequently clogs and requires cleaning or replacement.

Embodiments of the present invention provide a vacuum trap labyrinth (VTL) with improved trapping characteristics. Namely, it traps residue while not being as prone to clogging as prior art filter elements. Embodiments of the VTL are comprised of an inner part and an outer part that fit together while in use, and come apart for easy cleaning during maintenance.

FIG. 3A is a side view of the inner part 300 of a vacuum trap labyrinth in accordance with an embodiment of the present invention. Inner part 300 comprises base 304, and sidewall 302. Sidewall 302 is of a closed shape. In one embodiment, the sidewall 302 is cylindrical, so while two references for 302 are shown in FIG. 3A, both are part of the same sidewall. Central shaft 306 is hollow, and comprises intake vent 308, and has an opening within the base 304 (see 315 of FIG. 3C) to allow gas to exit. Central shaft 306 comprises annular lip 310 and annular groove 312. FIG. 3B is a top-down view of the inner part 300 of the vacuum trap labyrinth shown in FIG. 3A. FIG. 3C is a bottom-up view of the inner part 300 of the vacuum trap labyrinth shown in FIG. 3A. In this view, it can be seen that central shaft 306 is at a location within the perimeter of sidewall 302. Central shaft 306 allows gas to exit inner part 300 via opening 315 in the base 304. FIG. 3D is a perspective view of the inner part 300 of the vacuum trap labyrinth shown in FIG. 3A.

FIG. 4A is a side view of the outer part 400 of a vacuum trap labyrinth in accordance with an embodiment of the present invention. Outer part 400 comprises top 402, outer wall 404, and inner wall 406. Outer wall 404 and inner wall 406 are concentric. FIG. 4B is a top-down view of the outer part 400 of the vacuum trap labyrinth shown in FIG. 4A. In this view, top opening 411 is visible. This opening allows visibility into the central shaft 306 of inner part 300 when the VTL is assembled. Also visible in this view are access holes 418. These are small holes used to aid in separating the outer part and inner part during maintenance. FIG. 4C is an inverted perspective view of the outer part 400 of the vacuum trap labyrinth shown in FIG. 4A.

FIG. 5 is a side view of a completed VTL 500 showing the outer part 400 and inner part 300 of the vacuum trap labyrinth as assembled. The top 402 of outer part 400 rests on, and is supported by, the annular lip 310. The top opening 411 (FIG. 4B) allows the central shaft to protrude above top 402. In one embodiment, the outer part 400 and inner part 300 are comprised of stainless steel. In another embodiment, the outer part 400 and inner part 300 are comprised of aluminum.

FIG. 6 is a side view showing the outer part 400 and inner part 300 of the vacuum trap labyrinth as assembled within a catchpot 610. An O-ring 624 makes contact with the underside 627 of top 626 of catchpot 610. Preferably, top 626 is of a transparent material, such as glass, so that the interior of central column 316 may be visually inspected to see if excessive residue is present. The O-ring 624 serves to help keep residue away from the area off top 626 that is directly above central column 316, so that the interior of central column 316 is visible. Catchpot 610 has intake port 628 and output port 630. The gas flow, when using the vacuum trap labyrinth comprised of inner part 300 and outer part 400 is as follows below.

Gas enters catchpot 610 through intake port 628 (see arrow A1). The gas then travels downward between the outer wall 616 of catchpot 610 and wall 404 of outer part 400. The gas then travels upward (see arrow A3) between wall 404 of outer part and sidewall 302 of inner part 300. This upward and downward flow continues, as shown by arrows A4 and A5. Finally, at arrow A6, the gas enters intake vent 308 of central shaft 306, and exits the catchpot output port 630 (see arrow A7). The multiple direction changes of the gas (e.g. A3 to A4, or A4 to A5) create a pressure differential that changes the flow characteristics of the gas. This pressure differential helps cause the heavier process effluent (residue) to "drop out" on the VTL walls (e.g. 404, 302, 406) and not on the internal parts of the pump 102 (FIG. 1). Another factor that causes the residue to drop out on the VTL walls is that the VTL walls are cooler than the gases that are entering the VTL.

FIG. 7 is a block diagram of a semiconductor deposition system 700 incorporating a catchpot 710 with a vacuum trap labyrinth 500 in accordance with an embodiment of the present invention. System 700 comprises a pump 702, and a plurality of conduit lines, shown generally as 704 for pumping a gas mixture throughout system 700. The pumped material flows in the direction indicated by arrows F. The gas mixture is pumped from process chamber 708, which may comprise a chemical vapor deposition (CVD) process chamber. When the gas exits process chamber 708, it then proceeds to catchpot 710. Optionally, a trap 706 may be used to trap some heavier residue. The gas mixture is then passed through catchpot 710, which contains a vacuum trap labyrinth 500. The vacuum trap labyrinth 500 within catchpot 710 serves to trap residue (contaminants), such as TEOS that can result from processes such as chemical vapor deposition. After the gas exits from pump 702 it exits the system 700, typically being pumped to an abatement unit (not shown). Hence, by passing the gas through the catchpot 710, contaminants are removed from the gas prior to the gas entering pump 702.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A vacuum trap labyrinth comprising:
    an inner part comprising:
        a base;
        a sidewall attached to said base, said sidewall being of a closed shape, and having a perimeter;
        a hollow central shaft having a first end and a second end, wherein the first end is attached to said base at a location within the perimeter of the sidewall;
    an outer part comprising:
        a top portion;
        a plurality of concentric walls affixed to the top portion;
    wherein the central shaft of the inner part is disposed within the plurality of concentric walls of the outer part.

2. The vacuum trap labyrinth of claim 1, wherein the inner part and outer part are cylindrical.

3. The vacuum trap labyrinth of claim 1, wherein the second end of the central shaft comprises an annular lip, said annular lip configured and disposed to support the outer part.

4. The vacuum trap labyrinth of claim 3, wherein the second end of the central shaft further comprises an annular groove.

5. The vacuum trap labyrinth of claim 1, wherein the inner part and outer part are comprised of stainless steel.

6. The vacuum trap labyrinth of claim 1, wherein the inner part and outer part are comprised of aluminum.

7. The vacuum trap labyrinth of claim 1, wherein the plurality of concentric walls on the outer part comprises two concentric walls.

8. The vacuum trap labyrinth of claim 1, wherein the central shaft of the inner part comprises an intake vent.

9. The vacuum trap labyrinth of claim 1, wherein the top portion of the outer part comprises a plurality of removal-tool holes.

10. The vacuum trap labyrinth of claim 9, wherein the plurality of removal-tool holes comprises two removal-tool holes.

11. A deposition system comprising:
    a pump;
    a process chamber;
    a catchpot;
    a conduit connecting the pump, process chamber, and catchpot; and wherein the catchpot contains therein a vacuum trap labyrinth comprising:
    an inner part comprising:
        a base;
        a sidewall attached to said base, said sidewall being of a closed shape, and having a perimeter;
        a hollow central shaft having a first end and a second end, wherein the first end is attached to said base at a location within the perimeter of the sidewall;
    an outer part comprising:
        a top portion;
        a plurality of concentric walls affixed to the top portion;
    wherein the central shaft of the inner part is disposed within the plurality of concentric walls of the outer part.

12. The system of claim 11, wherein the inner part and outer part of the vacuum trap labyrinth are cylindrical.

13. The system of claim 11, wherein the second end of the central shaft of the inner part of the vacuum trap labyrinth comprises an annular lip, said annular lip configured and disposed to support the outer part of the vacuum trap labyrinth.

14. The system of claim 3, wherein the second end of the central shaft of the inner part of the vacuum trap labyrinth further comprises an annular groove.

15. The system of claim 11, wherein the vacuum trap labyrinth is comprised of stainless steel.

16. The system of claim 11, wherein the vacuum trap labyrinth is comprised of aluminum.

17. The system of claim 11, wherein the outer part of the vacuum trap labyrinth comprises two concentric walls.

18. A method of removing contaminants from a gas, comprising:
    passing the gas through a catchpot that contains a vacuum trap labyrinth therein, wherein the vacuum trap labyrinth comprises:
    an inner part comprising:
        a base;
        a sidewall attached to said base, said sidewall being of a closed shape, and having a perimeter;
        a hollow central shaft having a first end and a second end, wherein the first end is attached to said base at a location within the perimeter of the sidewall;
    an outer part comprising:
        a top portion;
    a plurality of concentric walls affixed to the top portion.

19. The method of claim 18, further comprising passing the gas through a pump.

20. The method of claim 19, further comprising passing the gas through a trap prior to passing the gas through the catchpot.

* * * * *